US012808037B2

(12) United States Patent
Yamaguchi et al.

(10) Patent No.: US 12,808,037 B2

(45) Date of Patent: Nov. 24, 2026

(54) METHOD AND APPARATUS FOR EMBEDDING TUNGSTEN INTO RECESS FORMED ON SUBSTRATE

(71) Applicant: Tokyo Electron Limited, Tokyo (JP)

(72) Inventors: Katsumasa Yamaguchi, Boise, ID (US); Shigeru Nakajima, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 81 days.

(21) Appl. No.: 18/584,114

(22) Filed: Feb. 22, 2024

(65) Prior Publication Data

US 2024/0295020 A1 Sep. 5, 2024

(30) Foreign Application Priority Data

Mar. 1, 2023 (JP) ................................. 2023-031280

(51) Int. Cl.

| | |
|---|---|
| ***C23C 16/14*** | (2006.01) |
| ***C23C 16/02*** | (2006.01) |
| ***C23C 16/04*** | (2006.01) |
| ***C23C 16/455*** | (2006.01) |
| ***C23C 16/52*** | (2006.01) |

(52) U.S. Cl.

CPC .......... *C23C 16/14* (2013.01); *C23C 16/0272* (2013.01); *C23C 16/045* (2013.01); *C23C 16/45527* (2013.01); *C23C 16/45553* (2013.01); *C23C 16/52* (2013.01)

(58) Field of Classification Search

CPC ... C23C 16/14; C23C 16/0272; C23C 16/045; C23C 16/45527; C23C 16/45553; C23C 16/52

See application file for complete search history.

(56) References Cited

U.S. PATENT DOCUMENTS

2005/0031786 A1* 2/2005 Lee .................. H01L 21/28556 257/E21.585
2015/0093911 A1* 4/2015 Nakatani ........... H01L 21/02123 438/761
2016/0351401 A1* 12/2016 Ba ......................... C23C 16/455
2017/0330829 A1* 11/2017 Wu .................. H01L 21/76879
2022/0195598 A1* 6/2022 Collins .................. C23C 16/08

FOREIGN PATENT DOCUMENTS

JP 2021-038442 A 3/2021
KR 10-2016-0140448 A 12/2016
KR 10-2019-0100859 A 8/2019
KR 10-2022-0139417 A 10/2022

* cited by examiner

*Primary Examiner* — Kelly M Gambetta

(74) *Attorney, Agent, or Firm* — Nath, Goldberg & Meyer; Jerald L. Meyer

(57) ABSTRACT

A method of embedding tungsten into a recess formed on a substrate, the method includes forming a lower tungsten layer by supplying a fluorine-free tungsten precursor gas containing a tungsten compound that does not contain fluorine atoms to a top surface of an aluminum oxide layer formed inside the recess, and embedding tungsten into the recess by supplying a tungsten precursor gas containing a tungsten compound that contains fluorine atoms to a top surface of the lower tungsten layer to form a main tungsten layer.

6 Claims, 10 Drawing Sheets

METHOD AND APPARATUS FOR EMBEDDING TUNGSTEN INTO RECESS FORMED ON SUBSTRATE

CROSS-REFERENCE TO RELATED APPLICATION

This application is based upon and claims the benefit of priority from Japanese Patent Application No. 2023-031280, filed on Mar. 1, 2023, the entire contents of which are incorporated herein by reference.

TECHNICAL FIELD

The present disclosure relates to a method and apparatus for embedding tungsten into a recess formed on a substrate.

BACKGROUND

In the manufacturing process of semiconductor devices, there is a processing in which a metal film, for example, a tungsten film, is formed on a semiconductor wafer (hereinafter also referred to as "wafer"), which is a substrate, to embed a wiring metal into a recess formed on the wafer.

For example, Patent Document 1 discloses a technology for forming a first tungsten film on a substrate with a base film formed thereon such as TiN film using a first tungsten-containing gas, followed by the formation of a second tungsten film thereon using a second tungsten-containing gas. Further, Patent Document 1 describes the use of a tungsten chloride-containing gas as the first tungsten-containing gas and a tungsten fluoride-containing gas as the second tungsten-containing gas.

PRIOR ART DOCUMENT

Patent Document

Patent Document 1: Japanese laid-open Publication No. 2021-038442

SUMMARY

According to one embodiment of the present disclosure, there is provided a method of embedding tungsten into a recess formed on a substrate, the method includes forming a lower tungsten layer by supplying a fluorine-free tungsten precursor gas containing a tungsten compound that does not contain fluorine atoms to a top surface of an aluminum oxide layer formed inside the recess, and embedding tungsten into the recess by supplying a tungsten precursor gas containing a tungsten compound that contains fluorine atoms to a top surface of the lower tungsten layer to form a main tungsten layer.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Recess Structure>

The present disclosure relates to a technology for embedding tungsten into a recess formed on the surface of a semiconductor wafer W, which is a substrate, by forming a tungsten film on the wafer W.

Figure 1:
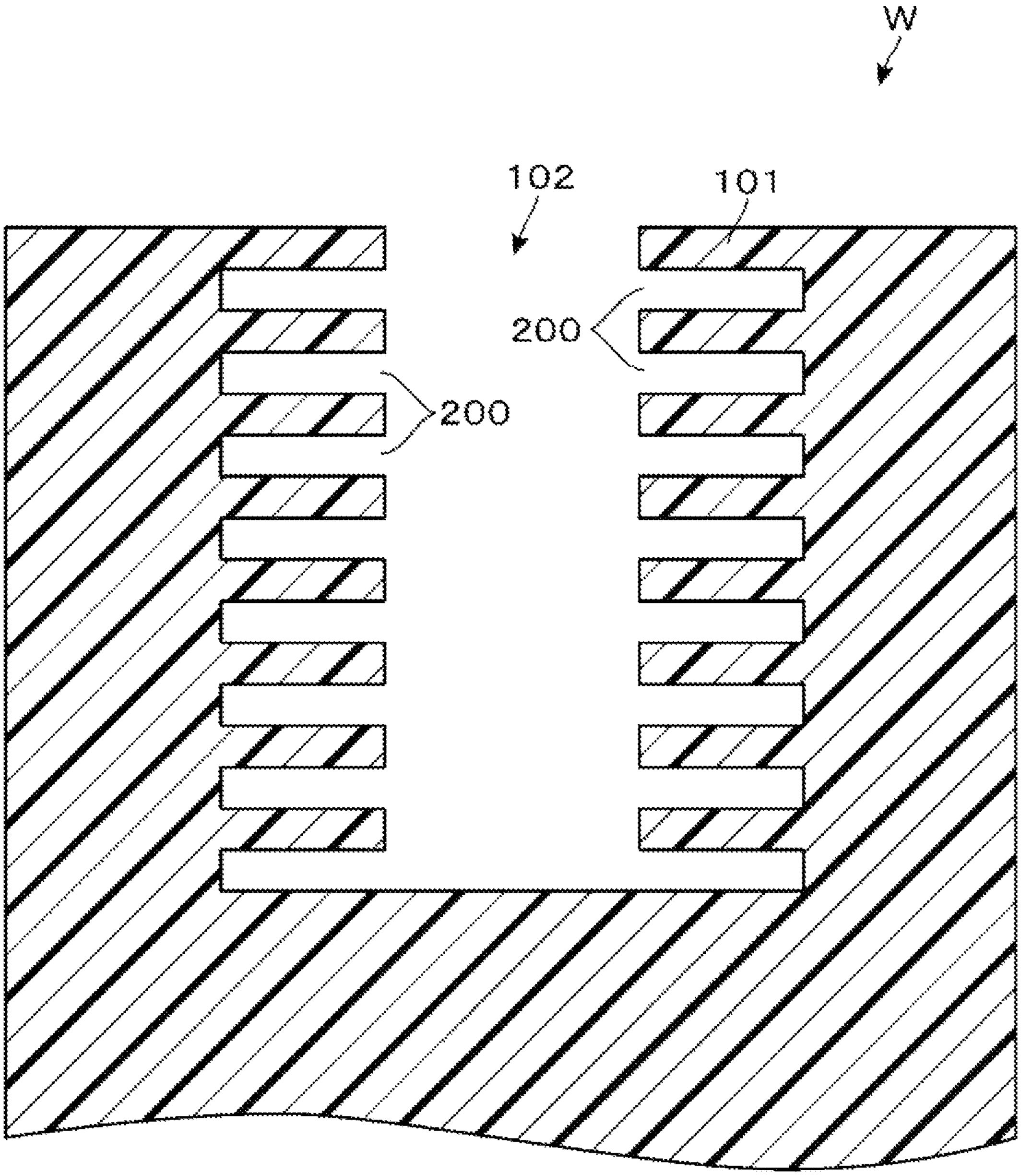
FIG. 1 is an enlarged longitudinal sectional view of the surface of a wafer to which an embedding method of the present disclosure is applied.

As illustrated in FIG. 1, the wafer W has a vertical groove 102 formed, for example, in a silicon oxide film 101 on the surface of the wafer W to extend in a direction intersecting the substrate surface (thickness direction of the wafer W). Furthermore, a plurality of horizontal grooves 200 are formed in the sidewall of the vertical groove 102 so as to be arranged in the thickness direction of the wafer W. These horizontal grooves 200 have openings that open to the sidewall surface of the vertical groove 102, and are formed as recesses extending from the openings in a direction along the substrate surface of the wafer W. Further, a tungsten embedding method according to the present disclosure is for embedding tungsten in these horizontal grooves 200 by forming a tungsten film on the surface of the wafer W.

However, the structure of the wafer W has been being increasingly miniaturized. Therefore, even in the configuration of the wafer W illustrated in FIG. 1, there may be a need for embedding tungsten in the horizontal grooves 200 with a large aspect ratio, where the depth of the groove is greater than the width of the opening. The aspect ratio may range from 1 to 500, for example. However, when forming a film to embed tungsten in the horizontal groove 200 with a narrow opening, there is a risk of the opening blockage due to the film being formed ahead of time on the opening side. As a result, voids (seams) may be left inside the horizontal grooves 200.

<Stacked Structure According to Comparative Embodiment>

Figure 2:
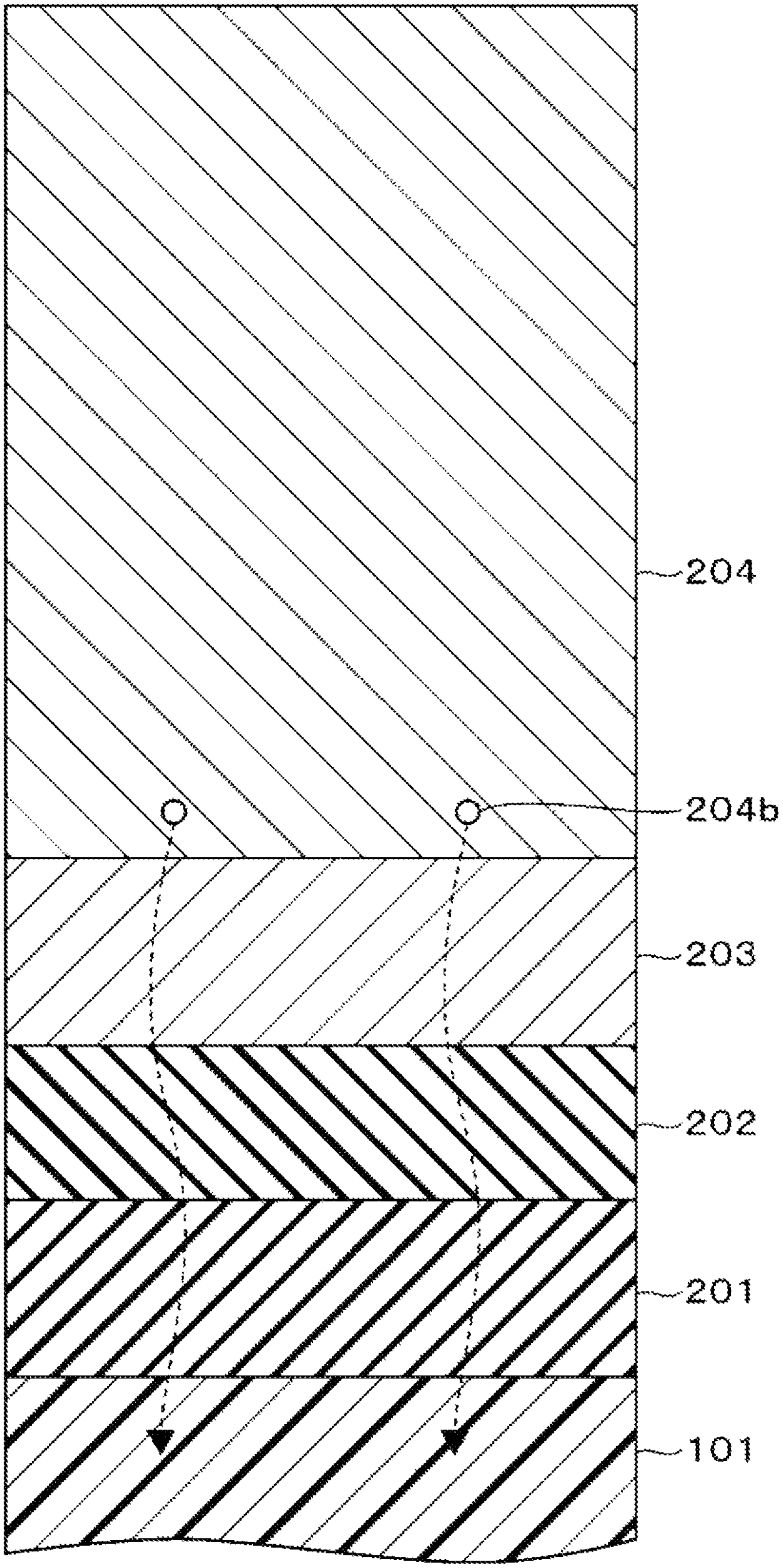
FIG. 2 is a schematic diagram of a stacked structure according to a comparative embodiment.
Figure 6:
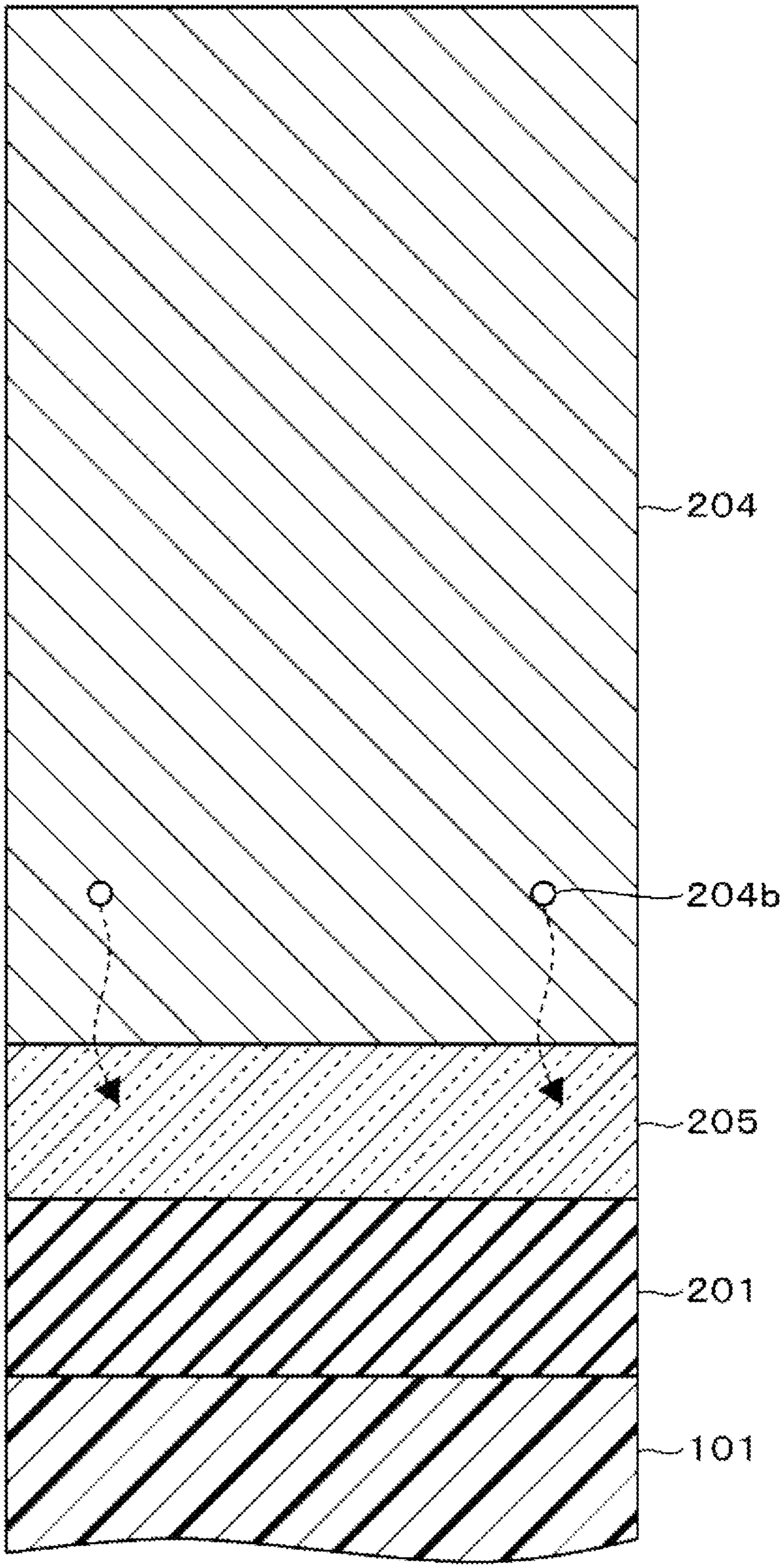
FIG. 6 is a schematic diagram of a stacked structure according to another example.
Figure 7:
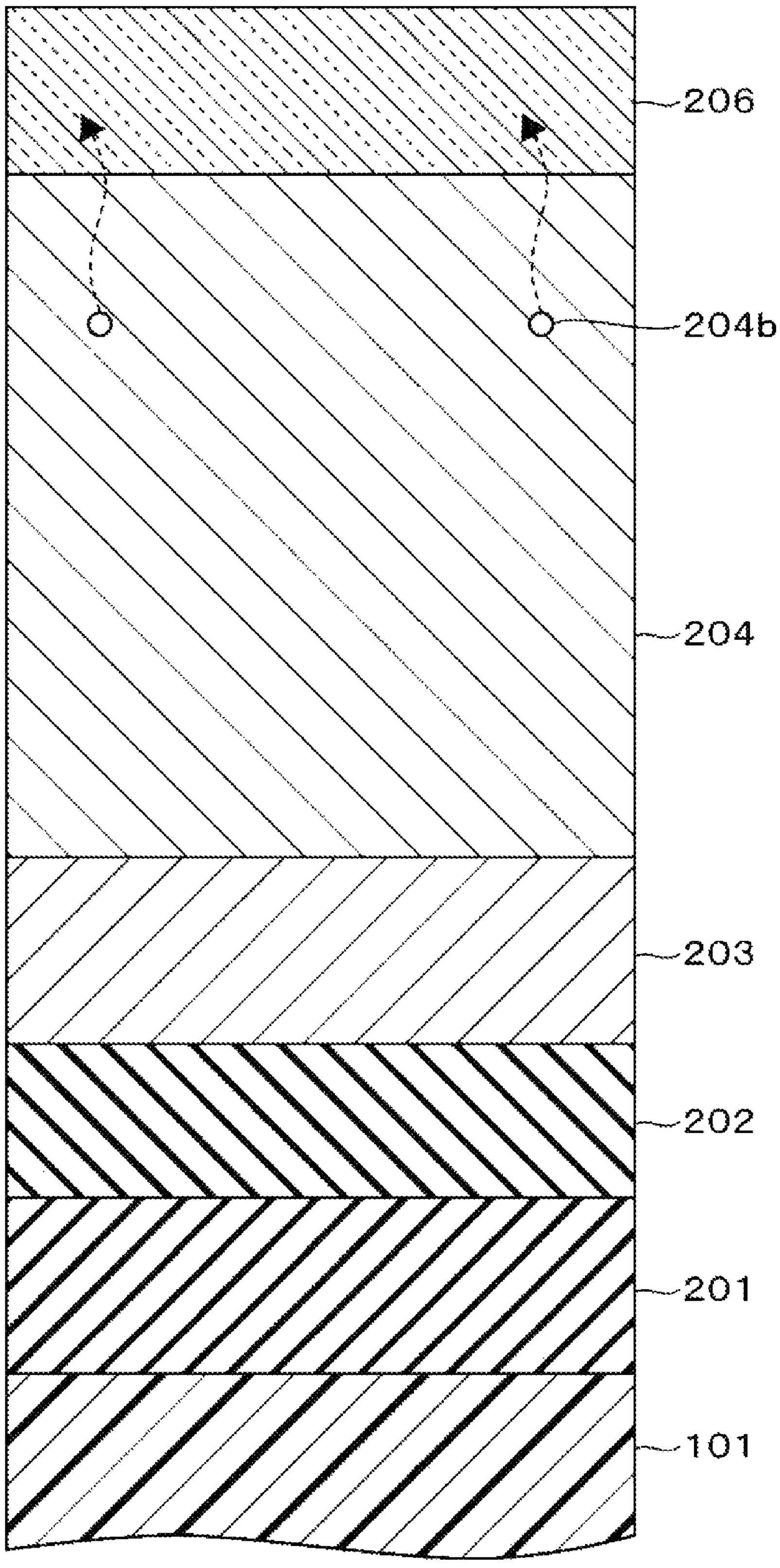
FIG. 7 is a schematic diagram of a stacked structure according to yet another embodiment.

FIG. 2 illustrates an example of a stacked structure according to a comparative embodiment, which is formed inside the above-described horizontal groove 200. In the stacked structure illustrated in FIG. 2, layers formed earlier are illustrated on the lower side (similarly in FIGS. 4, 6 and 7 hereinafter). An AlO layer 201, a TiN layer 202, a nucleation layer 203, and a main tungsten layer 204 are stacked on the top surface of the silicon oxide film 101, which constitute the wall surface of the horizontal groove 200.

The AlO layer 201 is a film that functions as an electrical buffer between the silicon oxide film 101 and tungsten. The TiN layer 202 functions as a barrier layer to prevent the diffusion of fluorine atoms (F), boron atoms (B), and others that remain in the stacked structure, and also functions as an adhesion layer to ensure adhesion between the AlO layer 201 and the main tungsten layer 204.

The nucleation layer 203 serves as nuclei for growing the main tungsten layer 204. The nucleation layer 203 is formed, for example, by reacting a precursor gas including tungsten hexafluoride ($WF_6$) as a tungsten precursor (hereinafter referred to as "$WF_6$ gas") with a $B_2H_6$ (diborane) gas which is a reducing gas. The formation of the nucleation layer 203 may employ, for example, an atomic layer deposition (ALD) method. Since $B_2H_6$ is used as the reducing gas, the nucleation layer 203 contains B atoms and has a higher resistance value compared to the main tungsten layer 204.

The main tungsten layer 204 is embedded in the horizontal groove 200 to constitute a wiring metal. The main tungsten layer 204 is formed by reacting a $WF_6$ gas with a hydrogen ($H_2$) gas which is a reducing gas, for example, through the ALD method. The main tungsten layer 204, which uses $H_2$ as the reducing gas, has a lower resistance value compared to the nucleation layer 203. However, it is difficult to directly form the main tungsten layer without using the nucleation layer 203 since nucleation is difficult to occur on the surface of the AlO layer 201 or TiN layer 202.

Figure 3:
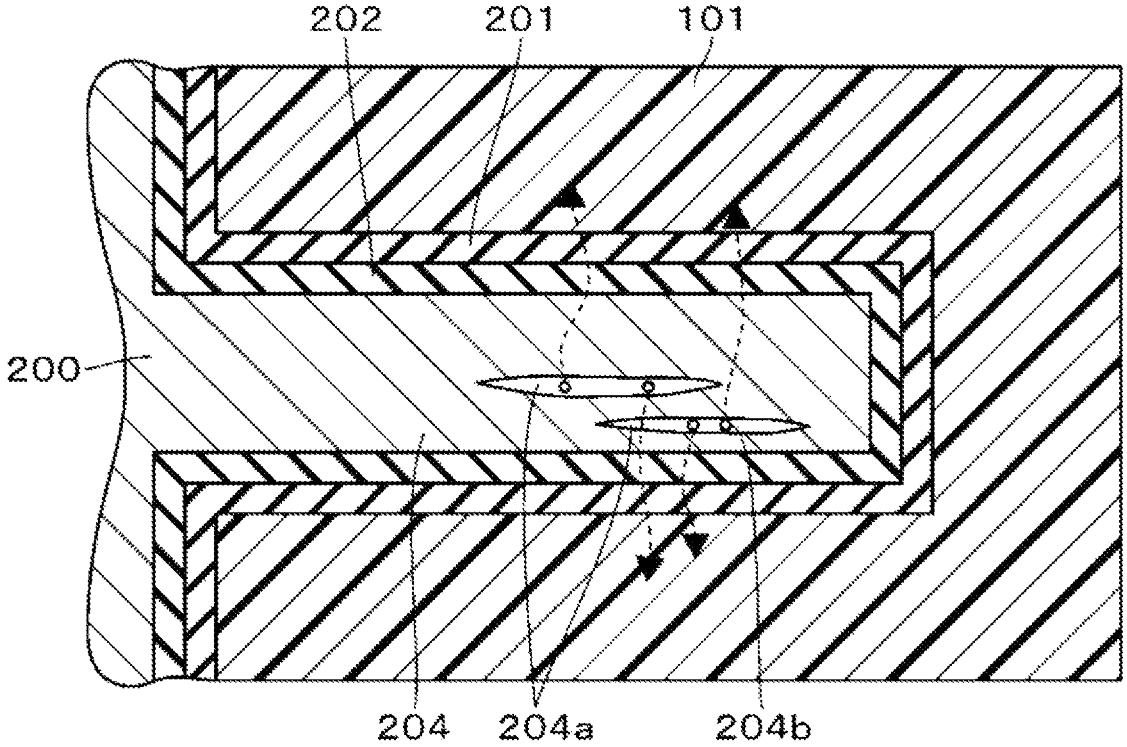
FIG. 3 is a schematic diagram illustrating a state where tungsten is embedded into a recess using the stacked structure according to the comparative embodiment.

FIG. 3 illustrates a state where the stacked structure according to the comparative embodiment illustrated in FIG. 2 is formed inside the horizontal groove 200 to implement the embedding of tungsten. In addition, in FIG. 3, the illustration of the nucleation layer 203 illustrated in FIG. 2 is omitted. As already described, the film formation inside the horizontal groove 200 is implemented using a tungsten gas ($WF_6$ gas) containing a tungsten compound ($WF_6$) that contains F atoms. Therefore, the main tungsten layer 204 contains fluorine atoms 204*b*.

Further, as already described, there may be cases where a seam 204*a* is formed in the horizontal groove 200 with a large aspect ratio, and it is difficult to eradicate the formation of the seam 204*a*. At this time, it is understood that the fluorine atoms 204*b* contained in the main tungsten layer 204 tend to accumulate inside the seam 204*a*.

As described above, there is a risk that F atoms, which are contained inside the main tungsten layer 204 and accumulate in the seam 204*a*, diffuse in the main tungsten layer 204 to pass through the TiN layer 202 and AlO layer 201, thus reaching the silicon oxide film 101 (see the dashed arrows illustrated in FIG. 3). On the other hand, there is a possibility of the formation of hydrogen fluoride (HF) in the subsequent processing of the wafer W. HF may etch the silicon oxide film 101 or reduce the silicon oxide film 101 by F ions, which may potentially degrade the insulation performance of the silicon oxide film 101. A degradation in the insulation performance of the silicon oxide film 101 may lead to insufficient electrical separation between the adjacent horizontal grooves 200, deteriorating the characteristics of devices formed on the wafer W such as the generation of leakage current.

<Stacked Structure According to Embodiment>

Based on these problems, the technology of the present disclosure forms a tungsten film (lower tungsten layer 205 and upper tungsten layer 206 to be described later) using a tungsten compound that does not contain F atoms, thereby reducing the impact of diffusion of F atoms. Hereinafter, the stacked structure according to the embodiment will be described with reference to FIGS. 4 and 5.

Figure 4:
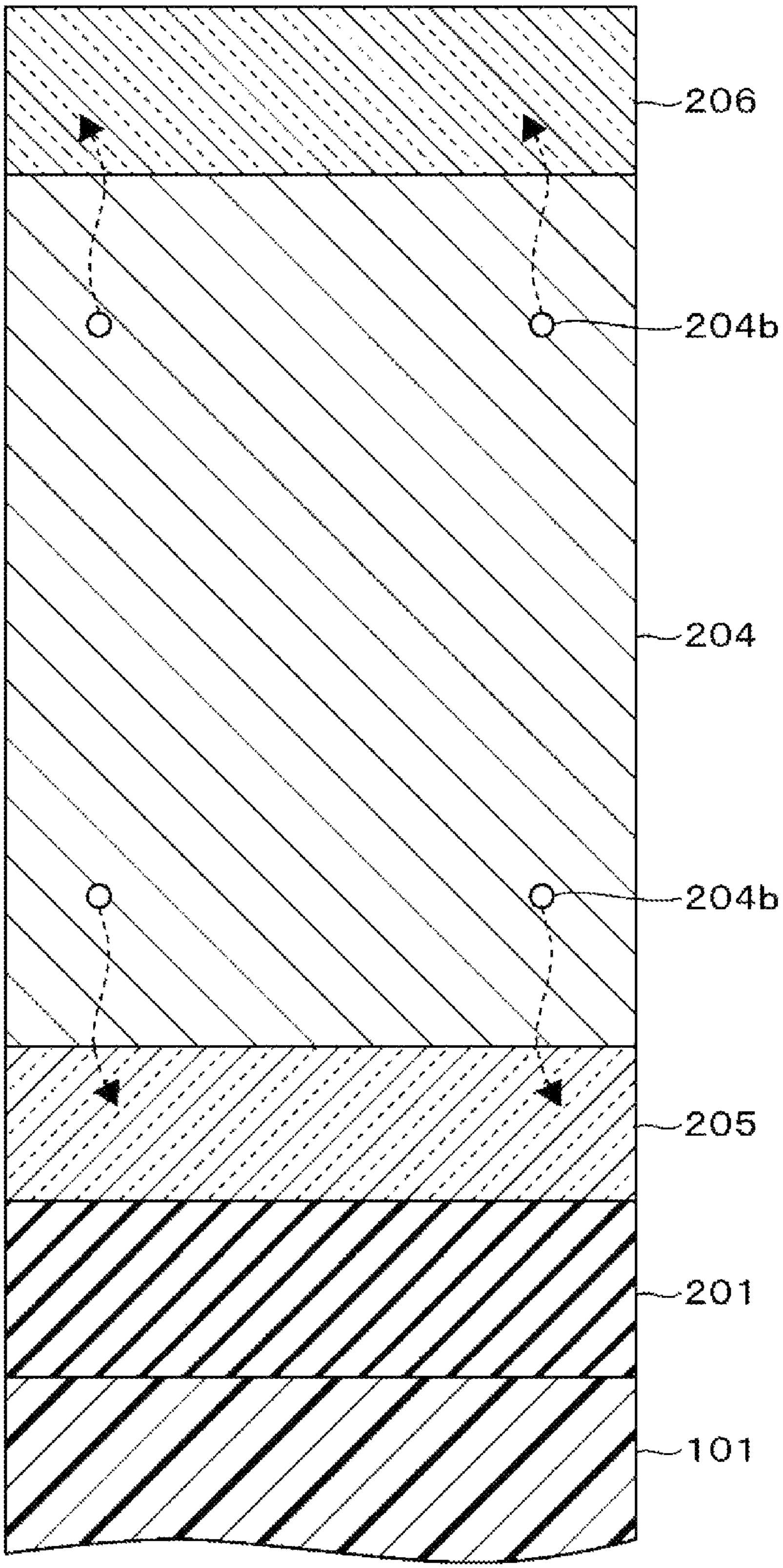
FIG. 4 is a schematic diagram of a stacked structure according to an embodiment.

FIG. 4 illustrates an example of a stacked structure according to an embodiment, which is formed inside the horizontal groove 200. The stacked structure illustrated in FIG. 4 differs from the comparative embodiment illustrated in FIG. 2 in that the formation of the TiN layer 202 on the top of the AlO layer 201 is omitted and a lower tungsten layer 205 and an upper tungsten layer 206 are formed on the lower surface and top surface of the main tungsten layer 204, respectively.

The lower tungsten layer 205 and upper tungsten layer 206 are each formed using a fluorine-free tungsten precursor gas containing a tungsten compound that does not contain F atoms. One example of the tungsten compound that does not contain F atoms may be a tungsten compound ($WO_xCl_y$) containing chlorine atoms, oxygen atoms, and tungsten atoms. Specific examples of $WO_xCl_y$ may include $WOCl_4$ and $WO_2Cl_2$.

The inventors have found that it is possible to achieve adhesion between the lower tungsten layer 205 and the AlO layer 201 even when the lower tungsten layer 205 is directly formed on the AlO layer 201 from $WO_xCl_y$ without using the TiN layer 202. The lower tungsten layer 205 may be formed by reacting a gas containing $WO_xCl_y$ ($WO_xCl_y$ gas) with a $H_2$ gas which is a reducing gas through the ALD method. Since the $WO_xCl_y$ gas does not contain F atoms, the lower tungsten layer 205 hardly contains F atoms. Further, the lower tungsten layer 205 also hardly contains B atoms since it may be formed directly on the AlO layer 201 without using a $B_2H_6$ gas as the reducing gas.

Further, another example of the tungsten compound that does not contain F atoms may be the use of a tungsten compound ($WCl_x$) that contains chlorine atoms and tungsten atoms but does not contain oxygen atoms. Specific examples of $WCl_x$ may include $WCl_5$ and $WCl_6$.

The inventors have also found that it is possible to achieve adhesion between the lower tungsten layer 205 and the AlO layer 201 even when the lower tungsten layer 205 is directly formed on the AlO layer 201 from $WCl_x$ without using the TiN layer 202. In this case, the lower tungsten layer 205 may be formed by reacting a gas containing $WCl_x$ ($WCl_x$ gas) with a $NH_3$ gas which is a reducing gas through the ALD method. Since the $WCl_x$ gas does not contain F atoms, the lower tungsten layer 205 hardly contains F atoms. Further, the lower tungsten layer 205 also hardly contains B atoms since it may be formed directly on the AlO layer 201 without using a $B_2H_6$ gas as the reducing gas. In addition, although the lower tungsten layer 205 contains nitrogen (N) atoms originating from the $NH_3$ gas, even if N atoms diffuse to the silicon oxide film 101 side, they pose less risk of deteriorating the insulation performance of the silicon oxide film 101 compared to F atoms.

It has been confirmed that the resistance value of the lower tungsten layer 205 formed using the $WO_xCl_y$ gas and $H_2$ gas is lower than that of the nucleation layer 203 and is approximately the same as that of the main tungsten layer 204. Further, it has been confirmed that the resistance value of the lower tungsten layer 205 formed using the $WCl_x$ gas and $H_2$ gas is lower than that of the nucleation layer 203 but may be higher than that of the main tungsten layer 204. The lower tungsten layer 205 is formed to have a thickness within the range of, for example, 3 nm to 4 nm (process of forming a lower tungsten layer).

The main tungsten layer 204 on the top surface of the lower tungsten layer 205 is formed by the same method as that for the main tungsten layer 204 of the stacked structure according to the comparative embodiment described with reference to FIG. 2. In other words, the main tungsten layer 204 is formed by reacting the $WF_6$ gas that contain F atoms with the $H_2$ gas which is a reducing gas, for example, through the ALD method. The main tungsten layer 204 is formed to be thicker than the lower tungsten layer 205 so as to be embedded in almost entire inside space of the horizontal groove 200 (process of embedding tungsten into a recess).

As already described, the lower tungsten layer 205 formed using the $WO_xCl_y$ gas may have a lower resistance value compared to the nucleation layer 203 of the comparative embodiment, and it may have approximately the same resistance value as that of the main tungsten layer 204. In this case, it is also possible to embed tungsten into the horizontal groove 200 using the $WO_xCl_y$ gas which forms the lower tungsten layer 205. In this regard, the $WO_xCl_y$ gas and $WCl_x$ gas are more expensive compared to the $WF_6$ gas. Therefore, for the main tungsten layer 204 requiring a larger quantity, it is suitable to use the $WF_6$ gas from the viewpoint of cost reduction. Further, when forming the lower tungsten layer 205 using the $WCl_x$ gas, it may be more effective, in terms of reducing the resistance value, to form the main tungsten layer 204 by the same conventional method (such as ALD using the $WF_6$ gas and $H_2$ gas).

The upper tungsten layer 206 is formed using a fluorine-free tungsten precursor gas such as the $WO_xCl_y$ gas or $WCl_x$ gas described above. In addition, since there is less difficulty in the formation of tungsten nuclei on the top surface of the main tungsten layer 204, even when using the $WCl_x$ gas, it is possible to form the upper tungsten layer 206 using a $H_2$ gas as the reducing gas.

As already described, since the $WO_xCl_y$ gas and $WCl_x$ gas do not contain F atoms, the upper tungsten layer 206 hardly contains F atoms. Further, it also hardly contains B atoms since it is formed without using a $B_2H_6$ gas as the reducing gas. The upper tungsten layer has approximately the same physical properties, such as the resistance value, as those for the above-described lower tungsten layer 205. The upper tungsten layer 206 is formed to have a thickness within the range of, for example, 3 nm to 4 nm (process of forming a upper tungsten layer).

The lower tungsten layer 205 and the upper tungsten layer 206 described above hardly contain F atoms. On the other hand, they have fewer grain boundaries and higher F atom capture performance compared to the TiN layer 202. Therefore, they can function to capture the fluorine atoms 204*b* diffusing from the main tungsten layer 204 side, preventing the diffusion thereof to the silicon oxide film 101 side.

<Action Effects>

Figure 5:
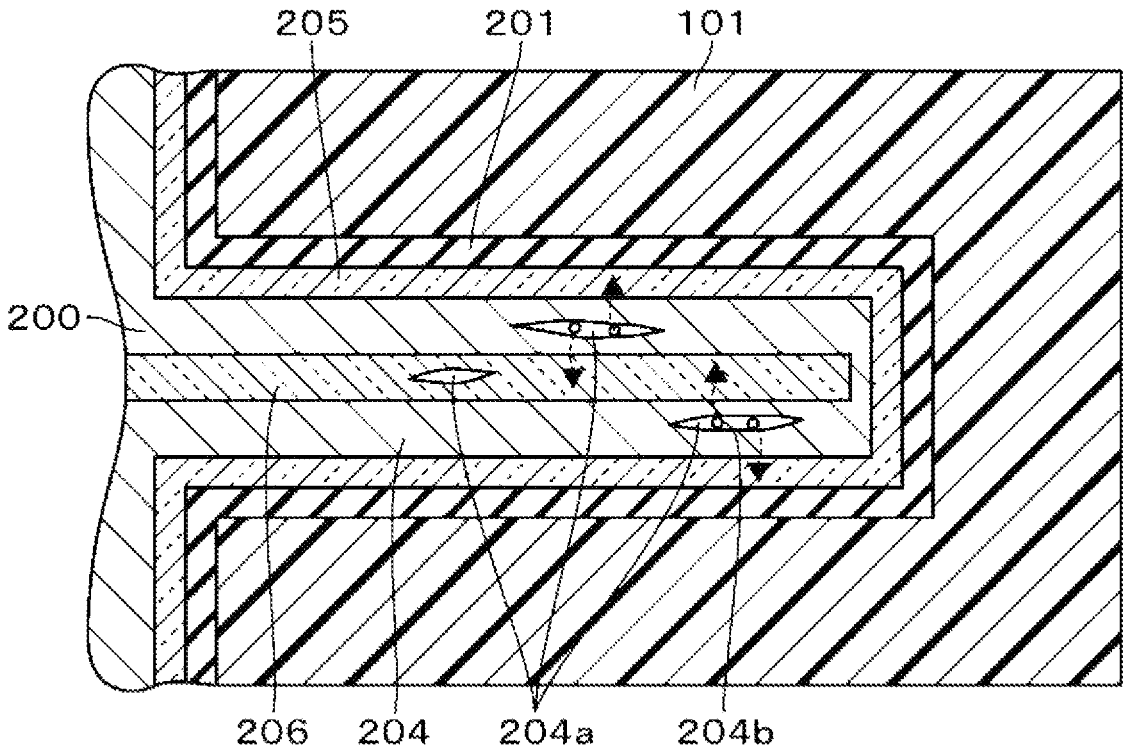
FIG. 5 is a schematic diagram illustrating a state where tungsten is embedded into a recess using the stacked structure according to the embodiment.

FIG. 5 illustrates a state where the stacked structure according to the embodiment illustrated in FIG. 4 is formed inside the horizontal groove 200. The main tungsten layer 204 embedded in the horizontal groove 200 contains the fluorine atoms 204*b* originating from a precursor gas, which tend to accumulate particularly inside the seam 204*a*. As already described, if these fluorine atoms 204*b* diffuse and reach the silicon oxide film 101, it may lead to a degradation in insulation performance.

To address this problem, the stacked structure according to the embodiment includes the lower tungsten layer 205 and the upper tungsten layer 206 formed on the lower surface and top surface of the main tungsten layer 204, respectively. In the stacked structure, even if the seam 204*a* is formed in the main tungsten layer 204, a state in which at least one lower tungsten layer 205 is formed between the seam 204*a* and the silicon oxide film 101 is made. Further, the upper tungsten layer 206 and two layers of the lower tungsten layer 205 are formed at intervals along the diffusion direction of the fluorine atoms 204*b*. With this configuration, it is possible to effectively capture the diffused fluorine atoms 204*b* in the lower tungsten layer 205 and upper tungsten layer 206, preventing them from reaching the silicon oxide film 101.

Further, even in a case where the seam 204*a* is formed in the upper tungsten layer 206, since the upper tungsten layer 206 is formed using a fluorine-free tungsten precursor gas, the accumulation of fluorine atoms 204*b* in the seam 204*a* due to the formation of the upper tungsten layer 206 hardly occurs. Further, even if the fluorine atoms 204*b* originating from the formation of the main tungsten layer 204 enter the seam 204*a*, the fluorine atoms 204*b* diffused from the seam 204*a* are captured by the upper tungsten layer 206 around the main tungsten layer 204, which makes it difficult for the fluorine atoms to diffuse further outward.

With the tungsten embedding method according to the present embodiment, a fluorine-free tungsten precursor gas is used to form the lower tungsten layer 205 and the upper tungsten layer 206 in a stacked structure. Further, the fluorine atoms 204*b* diffused from the main tungsten layer 204 or the seam 204*a* may be captured by these lower tungsten layer 205 and upper tungsten layer 206. As a result, it is possible to embed tungsten into the horizontal groove 200 formed in the wafer W while minimizing the impact of the fluorine atoms 204*b*.

<Variations>

Here, in the stacked structure embedded inside the horizontal groove 200, it is not an essential requirement to form both the lower tungsten layer 205 on the lower surface of the main tungsten layer 204 and the upper tungsten layer 206 on the top surface of the main tungsten layer 204. For example, as in a stacked structure illustrated in FIG. 6, only the lower tungsten layer 205 may be formed on the lower surface of the main tungsten layer 204. Further, for example, as in a stacked structure illustrated in FIG. 7, only the upper tungsten layer 206 may be formed on the top surface of the main tungsten layer 204. In these cases, it is still possible to prevent the diffusion of the fluorine atoms 204*b* to the silicon oxide film 101, compared to the stacked structure according to the comparative embodiment described with reference to FIG. 2.

<Substrate Processing System>

Figure 8:
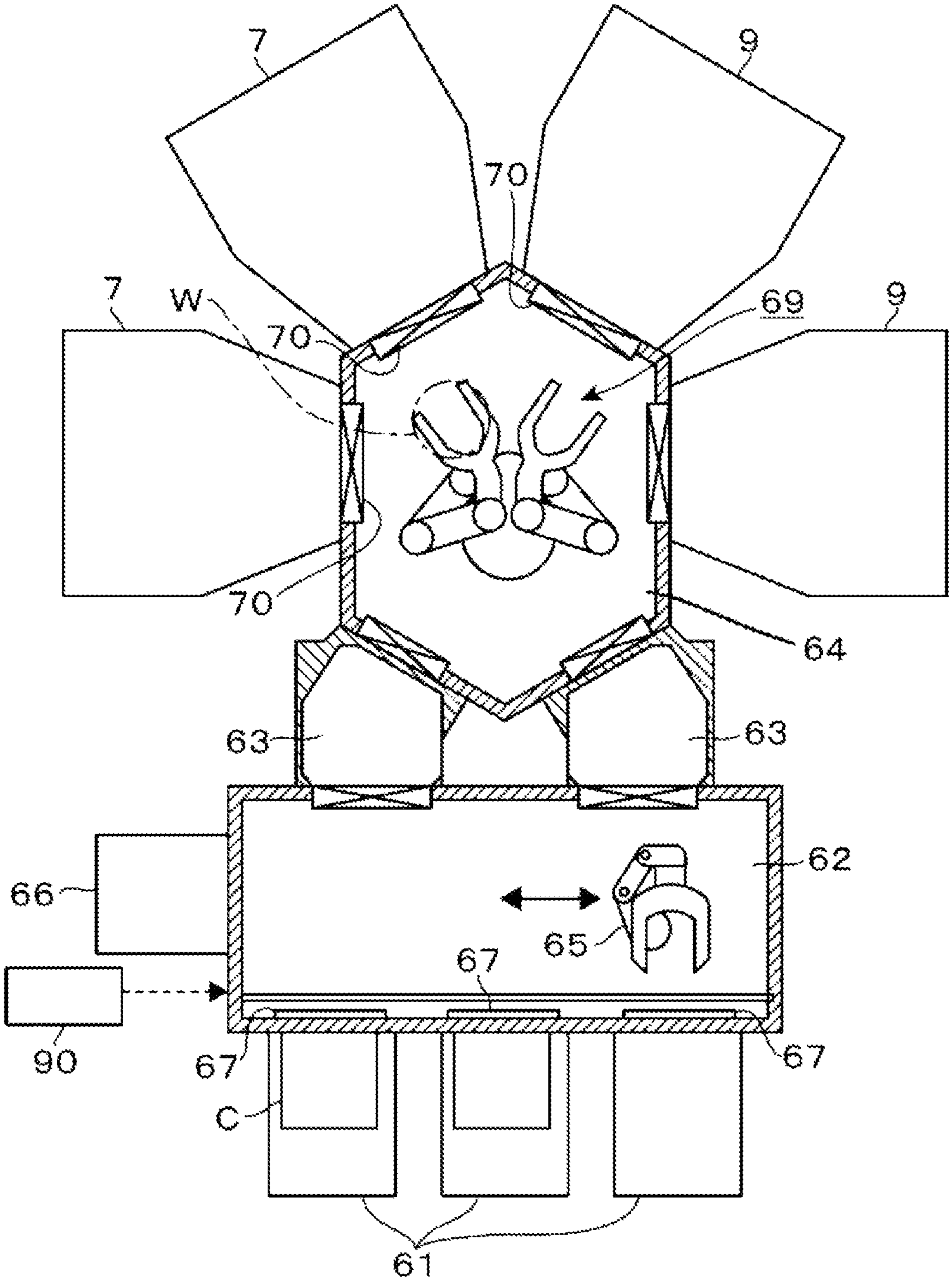
FIG. 8 is a plan view of a substrate processing system for executing the embedding method according to the present disclosure.

Next, a configuration example of a substrate processing system for implementing the above-described tungsten embedding method will be described. The substrate processing system is configured, for example, as a vacuum processing apparatus of a multi-chamber system. As illustrated in FIG. 8, the vacuum processing apparatus includes a horizontally long atmospheric pressure transfer chamber 62, which is maintained under an atmospheric pressure atmosphere by a $N_2$ gas, for example. A load port 61 is provided at the front of the atmospheric pressure transfer chamber 62 to implement the transfer of the wafer W, for example, to or from a transfer container C accommodating the wafer W therein. In FIG. 8, reference numeral 67 denotes an opening/closing door provided on a front wall of the atmospheric pressure transfer chamber 62. A transfer arm 65 for transferring the wafer W is provided inside the atmospheric pressure transfer chamber 62. Further, an alignment chamber 66 for adjusting the orientation and eccentricity of the wafer W is provided on a left wall of the atmospheric pressure transfer chamber 62 when viewed from the load port 61 side.

The atmospheric pressure transfer chamber 62 is provided with, for example, two load lock chambers 63 arranged side by side at the opposite side of the load port 61. The load lock chambers switch the internal atmosphere thereof between the atmospheric pressure atmosphere and the vacuum atmosphere while the wafer W is in a standby state. A vacuum transfer chamber 64 is located on the deeper side of the load lock chamber 63 when viewed from the atmospheric pressure transfer chamber 62. The above-described load lock chambers 63 are connected to the vacuum transfer chamber 64 via gate valves 70.

Further, the vacuum transfer chamber 64 is connected to an AlO layer forming apparatus 7 for forming the AlO layer 201 in the horizontal groove 200 of the wafer W and a tungsten embedding apparatus 9 for embedding tungsten into the horizontal groove 200 by forming the main tungsten layer 204. In this example, two AlO layer forming apparatuses 7 and two tungsten embedding apparatuses 9 are connected to the vacuum transfer chamber 64. The vacuum transfer chamber 64 is provided with a transfer arm 69, and the transfer arm 69 transfers the wafer W between each load lock chamber 63, AlO layer forming apparatus 7, and tungsten embedding apparatus 9.

The vacuum processing apparatus is provided with a controller 90 realized by, for example, a computer. The controller 90 includes a program, a memory, a data processor realized by a CPU, and like. The program incorporates instructions (each process) to send control signals from the controller 90 to each part of the vacuum processing apparatus and to proceed with each process of executing the formation of, for example, the AlO layer 201, lower tungsten layer 205, main tungsten layer 204, and upper tungsten layer 206. The program is stored in a non-transitory computer-readable storage medium, for example, a storage such as a flexible disk, compact disk, hard disk, magneto-optical (MO) disk, or non-volatile memory, and is installed in the controller 90.

Next, a configuration example of the tungsten embedding apparatus 9 will be described with reference to FIG. 9. The tungsten embedding apparatus 9 includes a processing container 10 that accommodates the wafer W. The processing container 10 is provided, on a sidewall thereof, with a loading/unloading port 11 for loading and unloading the wafer W, which is openable and closeable by a gate valve 12. An annular exhaust duct 13 is arranged on the top of the sidewall of the processing container 10 and has, for example, a slit 131 formed along an inner peripheral surface thereof and an exhaust port 132 formed on an outer wall thereof. A ceiling wall 14 is provided on an upper surface of the exhaust duct 13 to close an upper opening of the processing container 10. The processing container 10 is connected to the upstream end of a vacuum exhaust path 16 through the exhaust port 132. The downstream end of the vacuum exhaust path 16 is connected to a vacuum exhauster 17 realized by, for example, a vacuum pump, and the internal pressure of the processing container 10 is controlled by a pressure regulator (not illustrated).

A stage 2 for horizontally supporting the wafer W is provided in the interior of the processing container 10, and a heater 21 for heating the wafer W is buried in the stage 2. The stage 2 is configured to be vertically movable between a processing position (indicated by the solid line in FIG. 9) and a transfer position of the wafer W (indicated by the two-dot dashed line in FIG. 9) below the processing position by a lifting mechanism 24 via a support member 241. Three support pins 25 (only two are illustrated) for transferring the wafer W are provided below the stage 2 inside the processing container 10. These support pins 25 are vertically movable by a lifting mechanism 26 so as to protrude and retract with respect to an upper surface of the stage 2 at the transfer position. In FIG. 9, reference numeral 22 denotes through-holes for the support pins 25, and reference numerals 27 and 28 denote bellows that separate the atmosphere inside the processing container 10 from the outside air, and expand and contract, respectively, with the lifting operations of the stage 2 and support pins 25.

A shower head 3 is provided in the processing container 10 so as to face the stage 2. The shower head 3 serves to supply a processing gas into the process container 10 in a shower-like manner. The shower head 3 includes a main body 31 fixed to the ceiling wall 14 of the processing container 10 and a shower plate 32 connected to the lower portion of the main body 31, and the interior of the shower head forms a gas diffusion space 33. Gas discharge holes 34 are formed in the shower plate 32, and a gas supply system 4 is connected to the gas diffusion space 33 through a gas introduction hole 35.

The gas supply system 4 includes a first tungsten precursor gas supply that supplies the previously described $WO_xCl_y$ gas as a fluorine-free tungsten precursor gas and a second tungsten precursor gas supply that supplies a $WF_6$ gas as a tungsten precursor gas that contains fluorine atoms. Further, it includes a $H_2$ gas supply that supplies a $H_2$ gas as a reducing gas.

The first tungsten precursor gas supply includes a gas source **42*a* and supply path 421 for the $WO_xCl_y$ gas. For example, the $WO_xCl_y$ gas supply path 421 includes a flow rate adjuster 422, a storage tank 423, and a valve V2 sequentially arranged from the upstream side. The second tungsten precursor gas supply includes a gas source 41 and supply path 411 for the $WF_6$ gas. For example, the $WF_6$ gas supply path 411 includes a flow rate adjuster 412, a storage tank 413, and a valve V1 sequentially arranged from the upstream side. Further, the $H_2$ gas supply includes a gas source 43 and supply path 431 for the $H_2$ gas. For example, the $H_2$ gas supply path 431 includes a flow rate adjuster 432, a storage tank 433**, and a valve V3 sequentially arranged from the upstream side.

These $WO_xCl_y$ gas, $WF_6$ gas, and $H_2$ gas are temporarily stored in the storage tanks 423, 413 and 433, respectively. After being pressurized to a predetermined pressure inside these storage tanks 423, 413 and 433, they are then supplied into the processing container 10. The supply and stop of each gas from the storage tanks 423, 413 and 433 to the processing container 10 are performed by opening and closing the valves V2, V1 and V3.

Furthermore, the gas supply system 4 includes sources 44, 45 and 46 for an inert gas, for example, nitrogen ($N_2$) gas. In this example, the $N_2$ gas supplied from the source 45 serves as a purge gas for the $WO_xCl_y$ gas, and the source 45 is connected to the downstream side of the valve V2 in the $WO_xCl_y$ gas supply path 421 through a purge gas supply path 451. Further, the $N_2$ gas supplied from the source 44 serves as a purge gas for the $WF_6$ gas, and the source 44 is connected to the downstream side of the valve V1 in the $WF_6$ gas supply path 411 through a purge gas supply path 441. Further, the $N_2$ gas supplied from the source 46 serves as a purge gas for the $H_2$ gas, and the source 46 is connected to the downstream side of the valve V3 in the $H_2$ gas supply path 431 through a purge gas supply path 461. In addition, in FIG. 9, reference numerals 442, 452 and 462 denote respective flow rate adjusters, and reference numerals V4, V5 and V6 denote respective valves.

Further, the AlO layer forming apparatus 7 is configured almost identically to the tungsten embedding apparatus 9, except that respective gases supplied to the wafer W are different and the heating temperature of the wafer W is different. The description of a detailed configuration for forming the AlO layer 201 is omitted.

In such a vacuum processing apparatus, for example, the transfer container C accommodating the wafer W with the surface structure illustrated in FIG. 1 is loaded into the load port 61 of the vacuum processing apparatus. Furthermore, the wafer W is taken out from the transfer container C and is loaded into the alignment chamber 66 by way of the atmospheric pressure transfer chamber 62. After alignment is performed in the alignment chamber 66, the wafer W is transferred to the vacuum transfer chamber 64 by way of the load lock chamber 63. Subsequently, the wafer is transferred by the transfer arm 69 to the AlO layer forming apparatus 7, where the AlO layer 201 is formed by a predetermined film forming method. Thereafter, the wafer W is taken out by the transfer arm 69 and is transferred to the tungsten embedding apparatus 9.

In the tungsten embedding apparatus 9, initially, the lower tungsten layer 205 with a predetermined film thickness is formed through the ALD method by alternately switching between the supply of the $WO_xCl_y$ gas from the first tungsten precursor gas supply and the supply of the $H_2$ gas from the $H_2$ gas supply. Subsequently, the gas supplied to the wafer W is changed to the $WF_6$ gas from the second tungsten precursor gas supply. Further, the main tungsten layer 204 is formed through the ALD method by alternately switching between the supply of the $WF_6$ gas and the supply of the $H_2$ gas. Finally, the gas supplied to the wafer W is changed again to the $WO_xCl_y$ gas from the first tungsten precursor gas supply. Further, the upper tungsten layer 206 with a predetermined film thickness is formed through the ALD method by alternately switching between the supply of the $WO_xCl_y$ gas and the supply of the $H_2$ gas.

As such, once tungsten has been embedded in the horizontal groove 200 with the formation of the lower tungsten layer 205, the main tungsten layer 204, and the upper tungsten layer 206 on the top surface of the AlO layer 201, the wafer W is transferred to the load lock chamber 63 under the vacuum atmosphere by the transfer arm 69. After switching the load lock chamber 63 from the vacuum atmosphere to the atmospheric pressure environment, the wafer W is then returned to the original transfer container C, for example, by the transfer arm 65.

Figure 9:
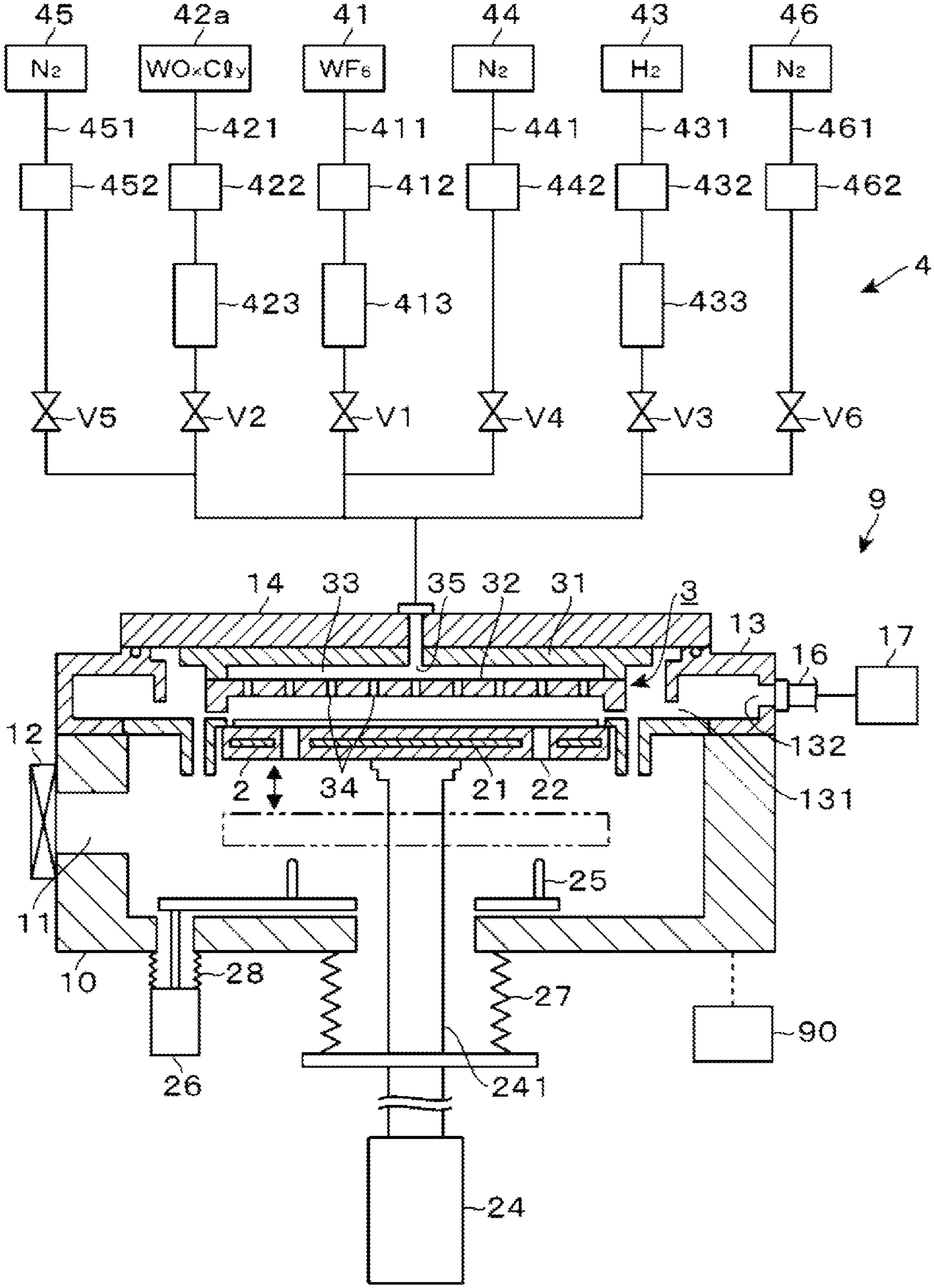
FIG. 9 is a longitudinal side view of a tungsten embedding apparatus provided in a film forming system.
Figure 10:
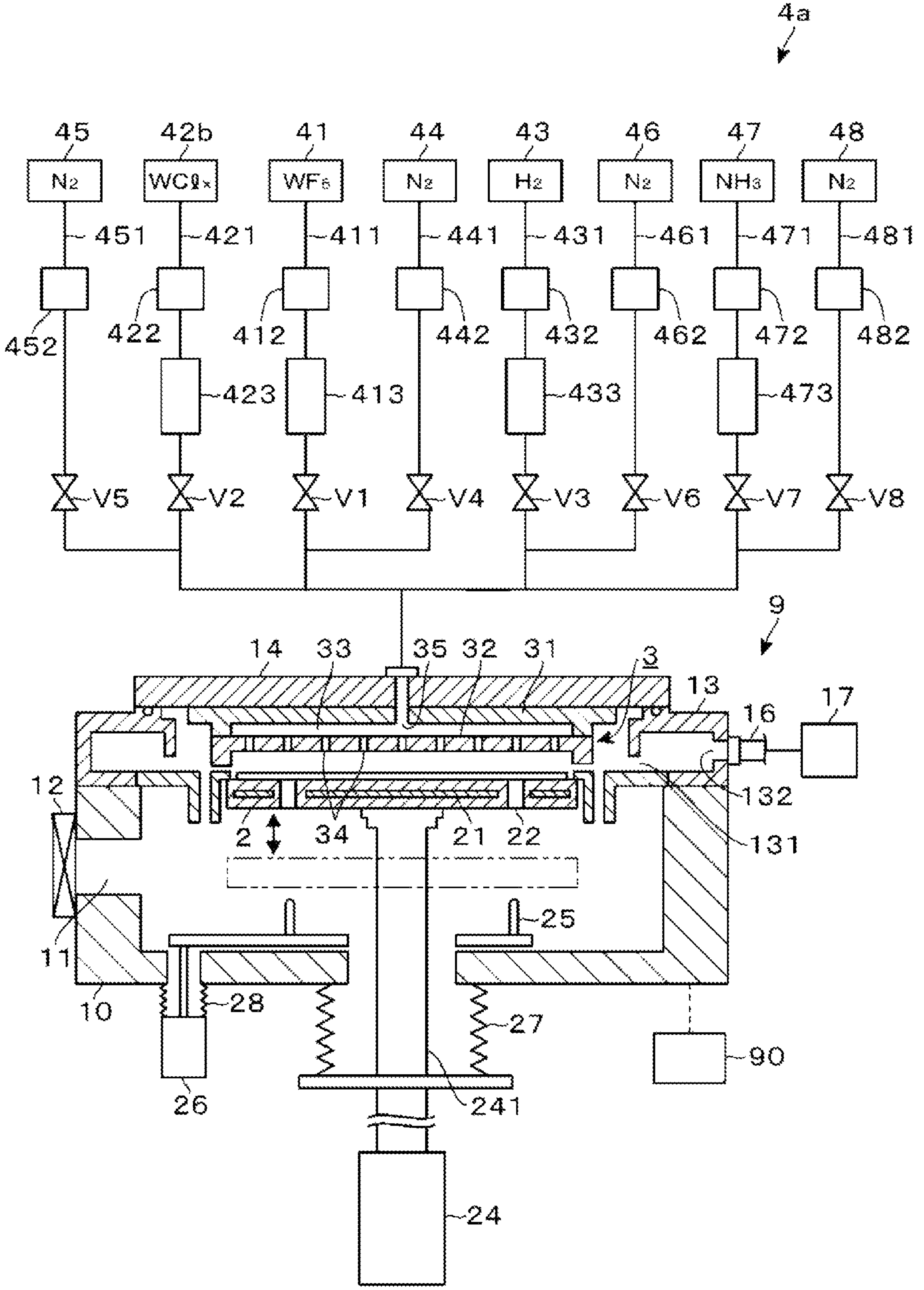
FIG. 10 is a longitudinal side view of a tungsten embedding apparatus according to another example.

Here, the configuration of the tungsten embedding apparatus 9 is not limited to the example illustrated in FIG. 9. For example, when supplying a $WCl_x$ gas from the first tungsten precursor gas supply to directly form the lower tungsten layer 205 on the top surface of the AlO layer 201, a $NH_3$ gas is used as a reducing gas for the $WCl_x$ gas as described above. FIG. 10 illustrates an example configuration of the tungsten embedding apparatus 9 having a gas supply system 4*a* configured to supply a $WCl_x$ gas as a fluorine-free tungsten precursor gas and a $NH_3$ gas as a reducing gas. In the tungsten embedding apparatus 9 illustrated in FIG. 10, common components with the example described in FIG. 9 are denoted with the same reference numerals as those described in FIG. 9.

In this example, the first tungsten precursor gas supply includes a $WCl_x$ gas source 42*b* instead of the $WO_xCl_y$ gas source 42*a*. Further, a $NH_3$ gas supply and an inert gas supply corresponding thereto are added to the gas supply system. The $NH_3$ gas supply includes a gas source 47 and supply path 471 for the $NH_3$ gas. For example, the $NH_3$ gas supply path 471 includes a flow rate adjuster 472, a storage tank 473, and a valve V7 sequentially arranged from the upstream side. A $N_2$ gas source 48 is connected to the downstream side of the valve V7 in the $NH_3$ gas supply path 471 through a purge gas supply path 481. In addition, in FIG. 10, reference numeral 482 denotes a flow rate adjuster, and reference numeral V8 denotes a valve.

The embodiments disclosed herein should be considered to be exemplary and not limitative in all respects. The above embodiments may be omitted, replaced or modified in various embodiments without departing from the scope of the appended claims and their gist.

Example

Experiment

The differences in physical properties based on variations in the stacked structure formed in the wafer W were compared.

A. Experimental Conditions

Example

The stacked structure according to the embodiment described with reference to FIG. 4 was formed on the flat surface of the wafer W, and the concentration of fluorine atoms 204*b* in the surface of the stacked structure was measured. The concentration of fluorine atoms 204*b* was analyzed by secondary ion mass spectrometry. Further, film stress, surface roughness, and specific resistance were also checked.

Comparative Example

The stacked structure according to the comparative embodiment described with reference to FIG. 2 was formed on the flat surface of the wafer W, and the same parameters as those in Example were measured and checked.

B. Experiment Results

The concentration of fluorine atoms 204*b* was $1\times10^{19}/cm^3$ in the surface of the stacked structure according to Example. On the other hand, the concentration of fluorine atoms 204*b* was $4\times10^{20}/cm^3$ in the surface of the stacked structure according to Comparative Example. As such, in the stacked structure according to Example, the concentration of fluorine atoms 204*b* in the surface of the upper tungsten layer 206 was decreased by two digits than that in the surface of the main tungsten layer 204 according to Comparative Example. Therefore, it can be said that using a fluorine-free tungsten precursor gas to form the upper tungsten layer 206 may effectively prevent the diffusion of the fluorine atoms 204*b*. Further, in Example, it was confirmed that the film stress is lower than in Comparative Example, and the surface roughness and specific resistance are at the same level as in Comparative Example, so that the film has characteristics that are practically acceptable.

According to the present disclosure in some embodiments, it is possible to embed tungsten in a recess formed on a substrate while minimizing the impact of fluorine atoms contained in a tungsten compound.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of embedding tungsten into a recess formed on a substrate, the method comprising:

forming a lower tungsten layer directly on a top surface of an aluminum oxide layer formed inside the recess by supplying a fluorine-free tungsten precursor gas containing a tungsten compound that does not contain fluorine atoms; and embedding tungsten into the recess by supplying a tungsten precursor gas containing a tungsten compound that contains fluorine atoms to a top surface of the lower tungsten layer to form a main tungsten layer, wherein a tungsten compound that contains chlorine atoms, oxygen atoms, and tungsten atoms is used as the tungsten compound that does not contain fluorine atoms, and wherein the lower tungsten layer is formed in direct contact with the top surface of the aluminum oxide layer.

2. The method of claim 1, further comprising, after the embedding tungsten into the recess, forming an upper tungsten layer on a top surface of the main tungsten layer by supplying the fluorine-free tungsten precursor gas.

3. The method of claim 1, wherein the recess is formed in a sidewall of a vertical groove formed in a direction intersecting a surface of the substrate and is configured as a horizontal groove extending in a direction along a substrate surface.

4. A method of embedding tungsten into a recess formed on a substrate, the method comprising:

forming a lower tungsten layer directly on a top surface of an aluminum oxide layer formed inside the recess by supplying a fluorine-free tungsten precursor gas containing a tungsten compound that does not contain fluorine atoms;

forming a main tungsten layer on the lower tungsten layer by supplying a tungsten precursor gas containing a tungsten compound that contains fluorine atom; and forming an upper tungsten layer by supplying a fluorine-free tungsten precursor gas containing a tungsten compound that does not contain fluorine atoms, wherein a tungsten compound that contains chlorine atoms, oxygen atoms, and tungsten atoms is used as the tungsten compound that does not contain fluorine atoms, and wherein the lower tungsten layer is formed in direct contact with the top surface of the aluminum oxide layer.

5. The method of claim 4, wherein the recess is formed in a sidewall of a vertical groove formed in a direction intersecting a surface of the substrate and is configured as a horizontal groove extending in a direction along a substrate surface.

6. The method of claim 5, wherein the vertical groove and the horizontal groove are formed in a silicon oxide film.

* * * * *